(12) United States Patent
Yamamoto

(10) Patent No.: US 11,633,804 B2
(45) Date of Patent: Apr. 25, 2023

(54) LASER PROCESSING APPARATUS AND LASER PROCESSING METHOD

(71) Applicant: DISCO CORPORATION, Tokyo (JP)

(72) Inventor: Setsuo Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 819 days.

(21) Appl. No.: 16/020,397

(22) Filed: Jun. 27, 2018

(65) Prior Publication Data

US 2019/0001433 A1  Jan. 3, 2019

(30) Foreign Application Priority Data

Jun. 30, 2017  (JP) .............................. JP2017-129662

(51) Int. Cl.
| | |
|---|---|
| B23K 26/03 | (2006.01) |
| B23K 26/00 | (2014.01) |
| B23K 26/06 | (2014.01) |
| B23K 26/53 | (2014.01) |
| B23K 37/04 | (2006.01) |
| B23K 26/08 | (2014.01) |
| H01L 21/683 | (2006.01) |
| B25B 11/00 | (2006.01) |

(Continued)

(52) U.S. Cl.
CPC ........ *B23K 26/032* (2013.01); *B23K 26/0006* (2013.01); *B23K 26/0648* (2013.01); *B23K 26/0823* (2013.01); *B23K 26/0853* (2013.01); *B23K 26/0869* (2013.01); *B23K 26/53* (2015.10); *B23K 37/0408* (2013.01); *B25B 11/005* (2013.01); *H01L 21/67092* (2013.01); *H01L 21/6838* (2013.01); *B23K 2101/40* (2018.08); *B23K 2103/56* (2018.08)

(58) Field of Classification Search
CPC .............. B23K 26/032; B23K 26/0853; B23K 26/0823; B23K 26/0006; B23K 26/0648; B23K 26/53; B23K 37/0408; B23K 26/0869; B23K 2103/56; B23K 2101/40; B23K 26/064; B23K 26/0861; B23K 26/40; H01L 21/6838; H01L 21/67092; B25B 11/005

See application file for complete search history.

(56) References Cited

U.S. PATENT DOCUMENTS

2006/0196858 A1*  9/2006  Barron ................... B23K 26/03
219/121.69

FOREIGN PATENT DOCUMENTS

| JP | 2002192370 A | 7/2002 |
|---|---|---|
| JP | 2006190779 A | 7/2006 |

(Continued)

*Primary Examiner* — S. Behrooz Ghorishi
(74) *Attorney, Agent, or Firm* — Greer, Burns & Crain, Ltd.

(57) ABSTRACT

A laser processing apparatus includes: a chuck table for holding a single-crystal SiC ingot on a holding surface thereof; a laser beam applying unit for applying a laser beam to the single-crystal SiC ingot held on the holding surface of the chuck table; and a camera unit configured to capture an image of the single-crystal SiC ingot held on the holding surface of the chuck table. The chuck table includes a porous material making up the holding surface and a glass frame made of a non-porous material and having a recess defined therein and receiving the porous material fitted therein, and a negative pressure transfer path for transferring a negative pressure to the porous material fitted in the recess.

18 Claims, 10 Drawing Sheets

(51) Int. Cl.
  *H01L 21/67* (2006.01)
  *B23K 103/00* (2006.01)
  *B23K 101/40* (2006.01)

(56) References Cited

FOREIGN PATENT DOCUMENTS

| | | | |
|---|---|---|---|
| JP | 2006281434 A | | 10/2006 |
| JP | 2014150219 A | * | 8/2014 |
| JP | 2017041482 A | | 2/2017 |

* cited by examiner

LASER PROCESSING APPARATUS AND LASER PROCESSING METHOD

BACKGROUND OF THE INVENTION

Field of the Invention

The present invention relates to a laser processing apparatus and a laser processing method.

Description of the Related Art

There has been known a processing method of applying a laser beam to an silicon carbide (SiC) wafer such as a silicon wafer with devices formed thereon, along projected dicing lines or streets thereon, to partly remove function layers of the devices or to form a modified layer serving as a severance initiating point in the SiC wafer, after which the SiC wafer is divided into individual device chips (see, for example, Japanese Patent No. 3408805 and Japanese Patent Laid-open No. 2006-190779).

There has also been developed a processing method of slicing an SiC wafer made of SiC from a single-crystal SiC ingot made of SiC by applying a laser beam having a wavelength that is transmittable through SiC to form a modified layer serving as a peeling initiating point in the single-crystal SiC ingot and then peeling SiC wafer off the modified layer from the single-crystal SiC ingot (see, for example, Japanese Patent Laid-open No. 2017-041482).

SUMMARY OF THE INVENTION

According to the processing methods disclosed in Japanese Patent No. 3408805, Japanese Patent Laid-open No. 2006-190779, and Japanese Patent Laid-open No. 2006-281434, there are instances where it is important to process an SiC wafer up to its outer peripheral edge portion with a laser beam. When the SiC wafer is processed up to its outer peripheral edge portion with the laser beam, the laser beam may damage a chuck table that is supporting the SiC wafer if the laser beam overruns the outer peripheral edge portion of the SiC wafer or is transmitted through the SiC wafer.

According to the processing method disclosed in Japanese Patent Laid-open No. 2017-041482, a chuck table that is supporting a single-crystal SiC ingot may also possibly be damaged by a laser beam, as is the case with the processing method disclosed in Japanese Patent No. 3408805. In addition, the laser beam is applied to the single-crystal SiC ingot at an angle defined with respect to an orientation flat on the single-crystal SiC ingot for representing the crystal orientation thereof. When the orientation flat is to be detected by a camera unit according to the processing method disclosed in Japanese Patent Laid-open No. 2017-041482, if the orientation flat is superposed on the surface of a frame of metal such as stainless steel, for example, of the chuck table, then the illuminating light that is reflected by the surface of the frame tends to make the contrast between the edge of the orientation flat and the frame unclear, making it impossible to detect the orientation flat.

It is therefore an object of the present invention to provide a laser processing apparatus and a laser processing method which are capable of preventing a chuck table from being damaged by a laser beam.

In accordance with an aspect of the present invention, there is provided a laser processing apparatus including: a chuck table for holding a workpiece on a holding surface thereof; a laser beam applying unit configured to apply a laser beam to the workpiece held on the holding surface of the chuck table; and a camera unit configured to capture an image of the workpiece held on the holding surface of the chuck table. The chuck table includes a porous material making up the holding surface, and a glass frame made of a non-porous material and having a recess defined therein for receiving the porous material fitted therein, and a negative pressure transfer path for transferring a negative pressure to the porous material fitted in the recess.

Preferably, the porous material is provided as a porous glass plate. Preferably, the laser processing apparatus further includes a table base movable with respect to the laser beam applying unit, the glass frame being mounted on the table base.

Preferably, the laser beam applying unit includes a laser oscillator for oscillating the laser beam and a condensing lens for focusing the laser beam oscillated by the laser oscillator, the condensing lens being disposed in facing relation to the holding surface of the chuck table.

Preferably, the workpiece held on the chuck table has an outer peripheral edge portion supported on the glass frame in covering relation to the porous glass plate, and the glass frame transmits therethrough illuminating light emitted by the camera unit. Preferably, the laser beam has a wavelength that is transmittable through the workpiece. Alternatively, the laser beam has a wavelength that is absorbable by the workpiece.

In accordance with another aspect of the present invention, there is provided a laser processing method including: an alignment step of applying illuminating light to and capturing an image of an outer peripheral edge portion of a workpiece held on a holding surface of a chuck table and a glass frame, the holding surface being made of a porous material, the glass frame being made of a non-porous material and having a recess defined therein for receiving the porous material fitted therein and a negative pressure transfer path for transferring a negative pressure to the porous material fitted in the recess, and performing an alignment process to orient the workpiece based on the captured image; and after the alignment step, a laser processing step of applying a laser beam having a wavelength that is transmittable through or absorbable by the workpiece to process the workpiece.

The laser processing apparatus and the laser processing method according to the present invention are effective to prevent the chuck table from being damaged by the laser beam applied thereto.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments according to the present invention will be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

First Embodiment

Figure 1:
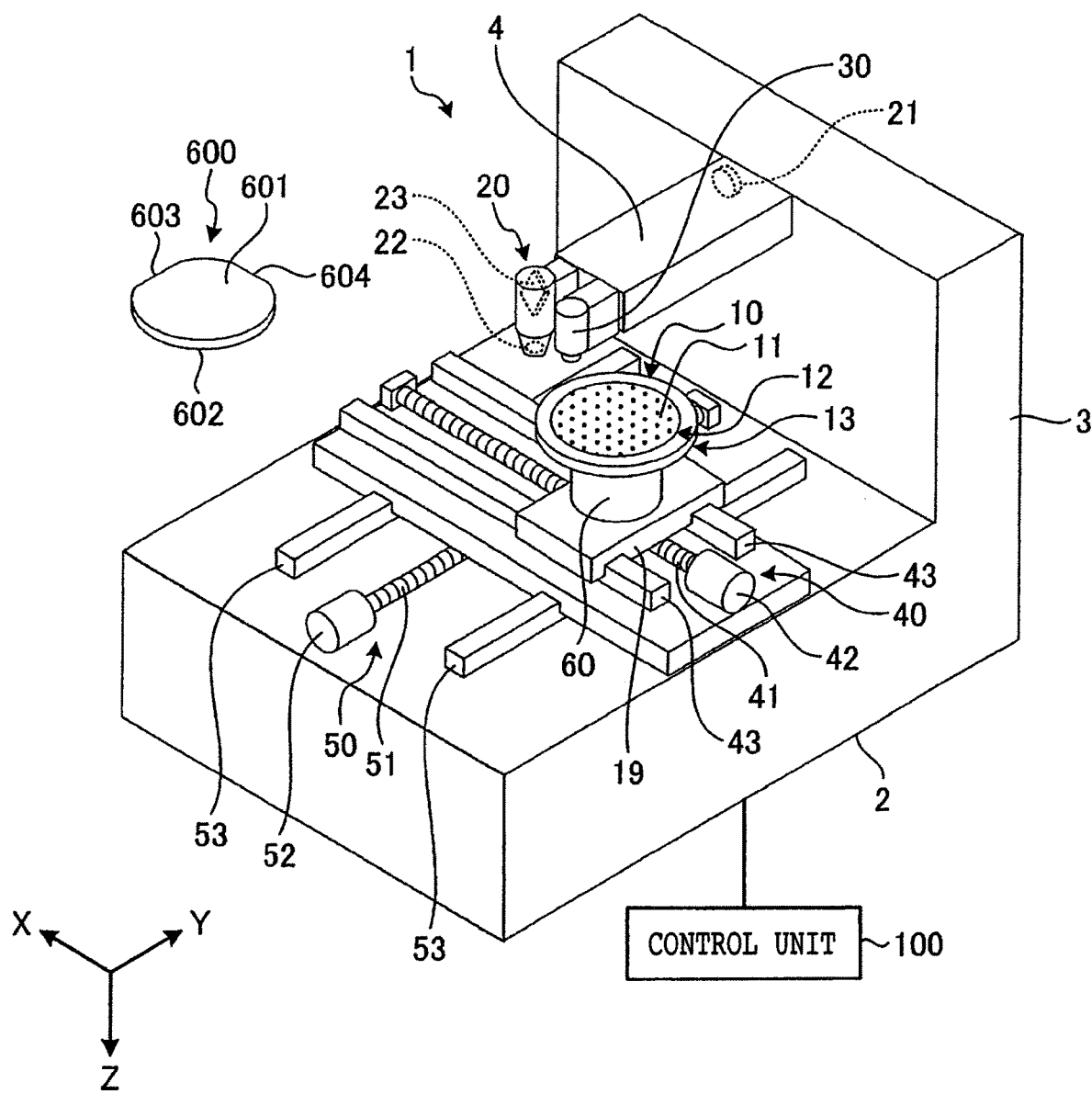
FIG. 1 is a perspective view showing by way of example a laser processing apparatus according to a first embodiment of the present invention.
Figure 2:
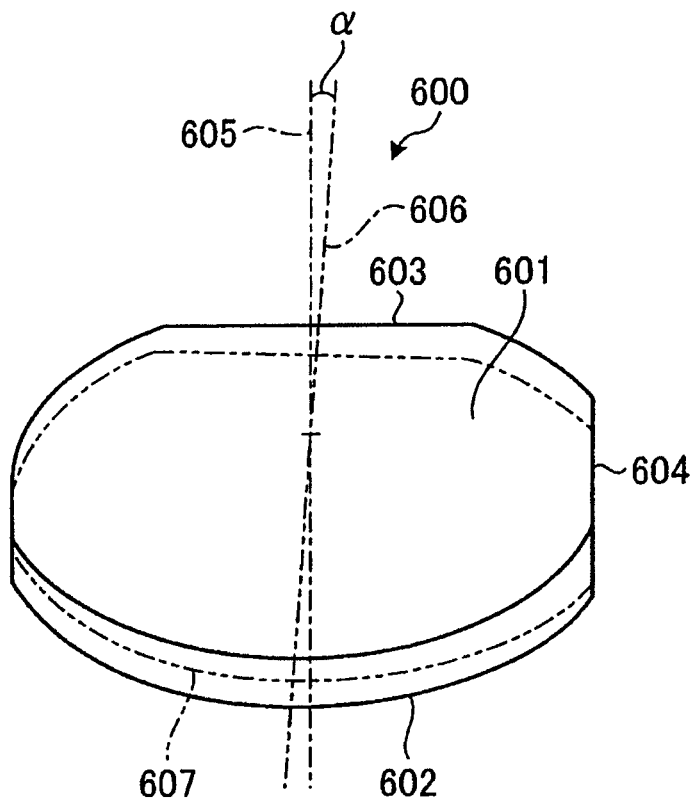
FIG. 2 is a perspective view of a single-crystal SiC ingot to be processed by the laser processing apparatus shown in FIG. 1.
Figure 3:
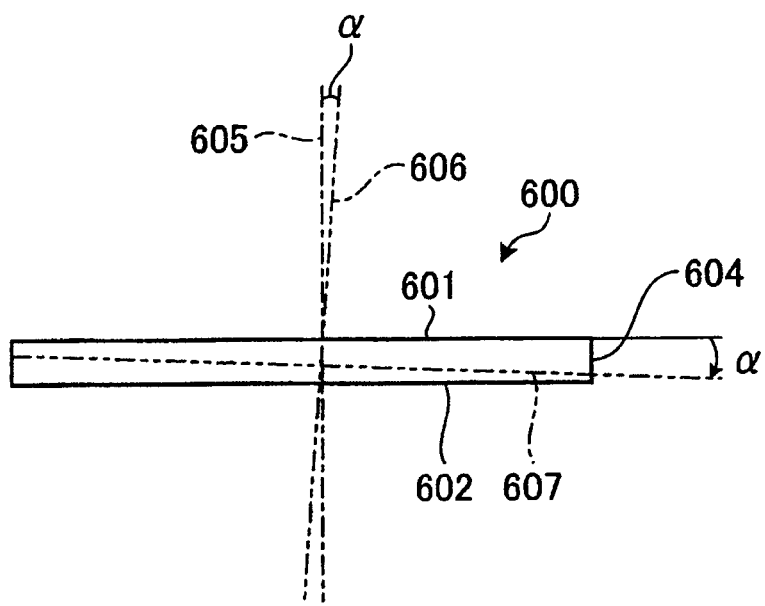
FIG. 3 is a side elevational view of the single-crystal SiC ingot shown in FIG. 2.
Figure 4:
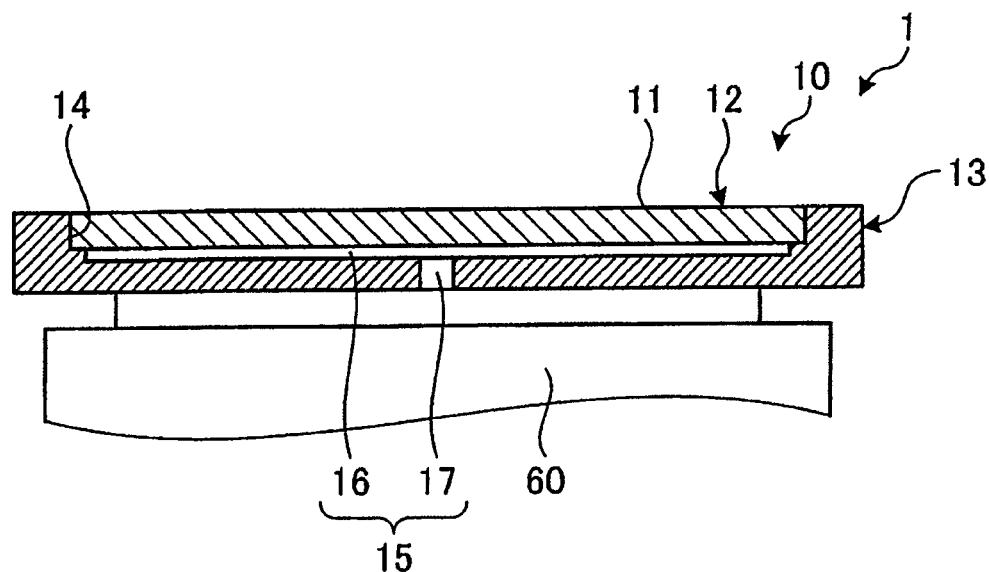
FIG. 4 is a cross-sectional view of a chuck table of the laser processing apparatus shown in FIG. 1.
Figure 5:
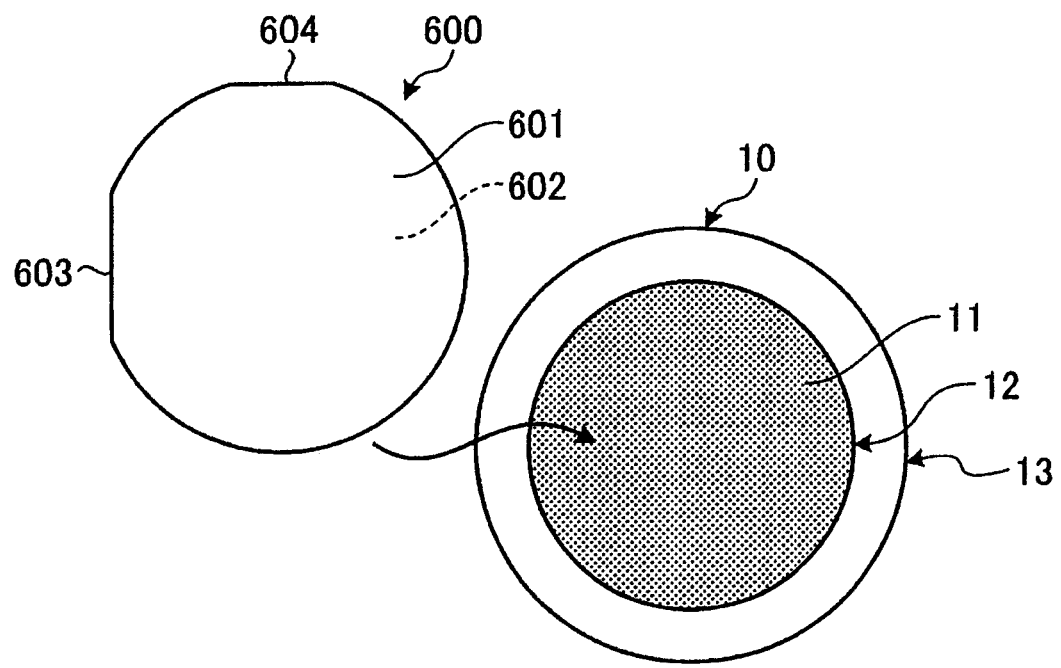
FIG. 5 is a plan view of the single-crystal SiC ingot shown in FIG. 2 and the chuck table shown in FIG. 4.

A laser processing apparatus and a laser processing method according to a first embodiment of the present invention will be described below with reference to the drawings. FIG. 1 is a perspective view showing by way of example of a laser processing apparatus according to a first embodiment of the present invention. FIG. 2 is a perspective view of a single-crystal SiC ingot to be processed by the laser processing apparatus shown in FIG. 1. FIG. 3 is a side elevational view of the single-crystal SiC ingot shown in FIG. 2. FIG. 4 is a cross-sectional view of a chuck table of the laser processing apparatus shown in FIG. 1. FIG. 5 is a plan view of the single-crystal SiC ingot shown in FIG. 2 and the chuck table shown in FIG. 4.

The laser processing apparatus, denoted by 1, according to the first embodiment is an apparatus for processing a single-crystal SiC ingot 600 as a workpiece with a laser beam. Specifically, the laser processing apparatus 1 slices the single-crystal SiC ingot 600, thereby cutting an SiC wafer from the single-crystal SiC ingot 600.

The single-crystal SiC ingot 600 to be processed by the laser processing apparatus 1 according to the first embodiment is made of SiC, and has a first surface (upper surface) 601 and a second surface (reverse side) 602 that is opposite the first surface 601, as shown in FIGS. 2 and 3. The first surface 601 of the single-crystal SiC ingot 600 has been polished to a mirror finish, serving as a surface to be irradiated with a laser beam 300 (see FIG. 11). The single-crystal SiC ingot 600 has on its outer circumferential edge a first orientation flat 603 and a second orientation flat 604 that extends perpendicularly to the first orientation flat 603. The first orientation flat 603 is longer than the second orientation flat 604.

The single-crystal SiC ingot 600 has a c-axis 606 that is inclined to a line 605 normal to the upper surface 601 by an off angle α in the direction toward the second orientation flat 604, and a c-plane 607 perpendicular to the c-axis 606. The c-plane 607 is inclined by an off angle α with respect to the upper surface 601 of the single-crystal SiC ingot 600. Generally, on a hexagonal single-crystal SiC ingot 600, the c-axis 606 is inclined in a direction perpendicular to the direction in which the shorter second orientation flat 604 extends. The c-plane 607 is established in the single-crystal SiC ingot 600 as countless planes on the molecular level of the single-crystal SiC ingot 600. According to the first embodiment, the off angle α is set to 4°. However, the off angle α is not limited to 4°, but may be freely set to a value in the range of 1° to 6°, for example, in the fabrication of the single-crystal SiC ingot 600.

As shown in FIG. 1, the laser processing apparatus 1 includes a chuck table 10 for holding the single-crystal SiC ingot 600 on a holding surface 11 thereof, a laser beam applying unit 20 for applying a laser beam 300 to the single-crystal SiC ingot 600 held on the chuck table 10, and a camera unit 30 for capturing an image of the single-crystal SiC ingot 600 held on the chuck table 10. The laser processing apparatus 1 also includes an X-axis moving unit 40 for relatively moving the chuck table 10 and the laser beam applying unit 20 in an X-axis direction or the opposite direction, a Y-axis moving unit 50 for relatively moving the chuck table 10 and the laser beam applying unit 20 in a Y-axis direction or the opposite direction, a rotating unit 60 for rotating the chuck table 10 about a central vertical axis parallel to a Z-axis direction, and a control unit 100 for controlling various components of the laser processing apparatus 1.

The chuck table 10, which is of a disk shape, includes, as shown in FIGS. 4 and 5, a porous glass plate 12 made of porous glass as a porous material that provides the holding surface 11 for holding the single-crystal SiC ingot 600 thereon and a glass frame 13 made of a non-porous material and surrounding the glass plate 12. The porous glass which the porous glass plate 12 is made of transmits the laser beam 300 or similar light rays therethrough. The porous glass plate 12, which is shaped as a circular plate and made of porous glass, has pores therein through which a fluid can be drawn. The chuck table 10 is of such a size that the porous glass plate 12 is covered by the single-crystal SiC ingot 600 held on the holding surface 11. According to the first embodiment, the porous glass plate 12 is made of porous glass as a porous material that provides the holding surface 11. According to the present invention, however, the holding surface 11 may be made of another type of porous material such as porous ceramics or the like.

The glass frame 13 is made of hermetic glass for transmitting the laser beam 300 or similar light rays therethrough. The glass frame 13 has a recess 14 defined therein for receiving the porous glass plate 12 fitted therein and a negative pressure transfer path 15 for transferring a negative pressure to the porous glass plate 12 fitted in the recess 14. The negative pressure transfer path 15 includes a space 16 defined in the glass frame 13 and a transfer hole 17 defined in the glass frame 13 and opening into the space 16, the transfer hole 17 being coupled to a vacuum suction source, not shown. The space 16 is sealed by the glass frame 13 and the porous glass plate 12. The transfer hole 17 is a hole that is open into the space 16 and extends through the bottom of the glass frame 13. When a vacuum generated by the vacuum suction source is transferred through the transfer hole 17 into the space 16, it acts on the single-crystal SiC ingot 600 through the porous glass plate 12 and holds the single-crystal SiC ingot 600 under suction on the porous glass plate 12.

The glass frame 13 is mounted on a table base 19 (see FIG. 1) with the rotating unit 60 interposed therebetween. The table base 19 is movable in the X-axis direction or the opposite direction with respect to the laser beam applying unit 20 by the X-axis moving unit 40.

The X-axis moving unit 40 serves as processing feed means for processing-feeding the chuck table 10 in the X-axis direction or the opposite direction by moving the chuck table 10 in the X-axis direction or the opposite direction. The X-axis moving unit 40 moves the table base 19 in the X-axis direction or the opposite direction. The Y-axis moving unit 50 serves as indexing feed means for indexing-feeding the chuck table 10 by moving the chuck table 10 in the Y-axis direction or the opposite direction. The X-axis moving unit 40 and the Y-axis moving unit 50 include respective ball screws 41 and 51 rotatable about their own axes, respective stepping motors 42 and 52 for rotating the respective ball screws 41 and 51 about their own axes, and respective pairs of guide rails 43 and 53 on which the chuck table 10 is supported for movement in the X-axis and Y-axis directions or the opposite directions. The rotating unit 60 is disposed on the table base 19 and supports the chuck table 10 thereon for rotation about the central vertical axis thereof.

The laser beam applying unit 20 processes an SiC wafer 200 held on the chuck table 10 with a laser beam. Specifically, the laser beam applying unit 20 applies a laser beam 300 having a wavelength of 1064 nm or the like, that is transmittable through the single-crystal SiC ingot 600, thereby to form modified layers 301 (see FIG. 11) in the single-crystal SiC ingot 600. A modified layer 301 refers to a region whose density, refractive index, mechanical strength, and other physical properties are different from those of surrounding regions, and may be exemplified by a molten region, a cracked region, a dielectric-breakdown region, a changed-refractive-index region, or a region containing a mixture of these regions.

The laser beam applying unit 20 includes a laser oscillator 21 for oscillating the laser beam 300, a condensing lens 22 for focusing the laser beam 300 oscillated by the laser oscillator 21 at a desired position in the single-crystal SiC ingot 600, and a mirror 23 for reflecting the laser beam 300 oscillated by the laser oscillator 21 toward the condensing lens 22. The condensing lens 22 is positioned in facing relation to the holding surface 11 of the chuck table 10. The condensing lens 22 and the mirror 23 are mounted on the distal end of a support arm 4 joined to an upstanding wall 3 mounted on an apparatus body 2 of the laser processing apparatus 1. The laser oscillator 21 is mounted in the support arm 4.

The camera unit 30 is disposed in juxtaposed relation to the laser beam applying unit 20 in the X-axis direction. According to the first embodiment, the camera unit 30 is mounted on the distal end of the support arm 4. The camera unit 30 includes a charge-coupled device (CCD) camera for capturing an image of the single-crystal SiC ingot 600 while applying illuminating light 400 (see FIG. 8) in the Z-axis direction to the single-crystal SiC ingot 600 held on the chuck table 10.

The control unit 100 serves to control the various components described above to enable the laser processing apparatus 1 to carry out a laser processing operation on the single-crystal SiC ingot 600. The control unit 100 includes a computer system. The control unit 100 includes an arithmetic processing unit having a microprocessor such as a central processing unit (CPU), a storage device having a memory such as a read only memory (ROM) or a random access memory (RAM), and an input/output interface.

The arithmetic processing unit of the control unit 100 performs arithmetic processing sequences according to computer programs stored in the storage device, and outputs control signals for controlling the laser processing apparatus 1 through the input/output interface to the various components described above of the laser processing apparatus 1. The control unit 100 is connected to a display unit, not shown, such as a liquid crystal display device for displaying states of the laser processing operation and images, and an input unit, not shown, that the operator of the laser processing apparatus 1 uses to register processing detail information, etc. The input unit includes at least one of a touch panel on the display unit, and a keyboard.

Figure 6:
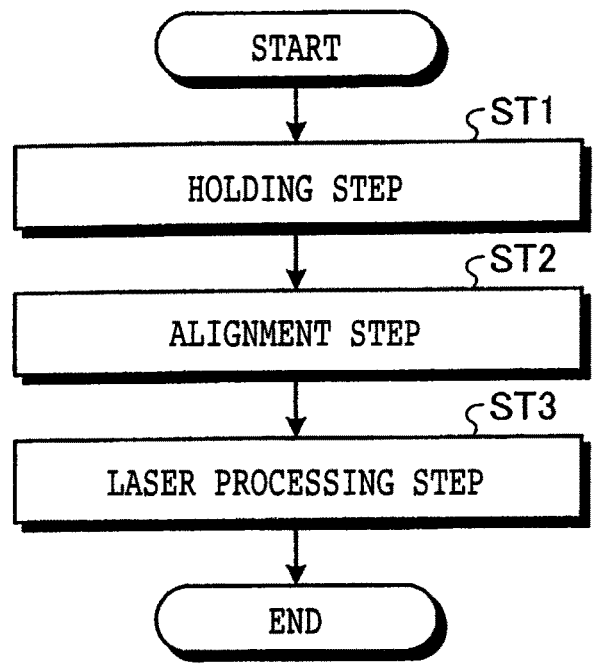
FIG. 6 is a flowchart illustrating a laser processing method according to the first embodiment.

Next, the laser processing method according to the first embodiment will be described below. FIG. 6 is a flowchart illustrating the laser processing method according to the first embodiment. As shown in FIG. 6, the laser processing method includes a holding step ST1, an alignment step ST2, and a laser processing step ST3. The laser processing method according to the first embodiment is carried out when the operator operates the input unit to register processing detail information in the control unit 100, places a single-crystal SiC ingot 600 to be processed with a laser beam on the holding surface 11 of the chuck table 10 such that the lower surface 602 of the single-crystal SiC ingot 600 covers the porous glass plate 12, and then enters a command to start a laser processing operation.

(Holding Step)

Figure 7:
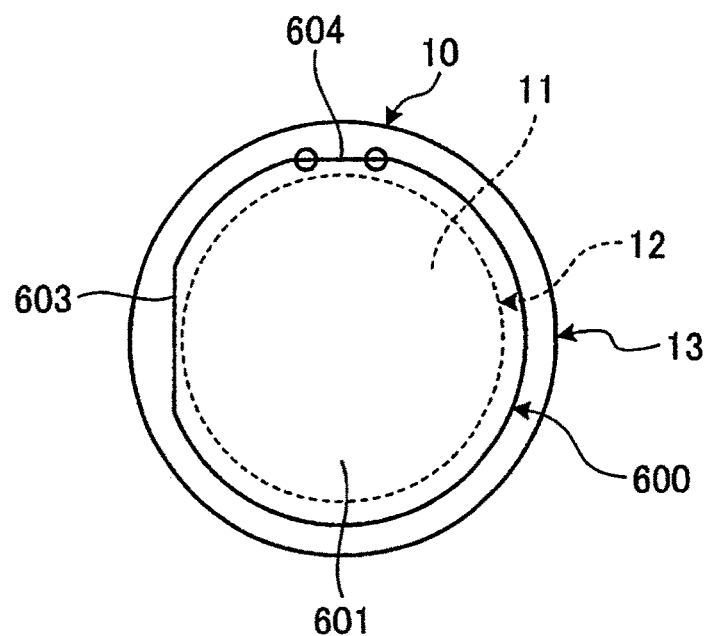
FIG. 7 is a plan view illustrating a holding step of the laser processing method shown in FIG. 6.

FIG. 7 is a plan view illustrating the holding step ST1 of the laser processing method shown in FIG. 6. The holding step ST1 is a step for holding the single-crystal SiC ingot 600 on the holding surface 11 of the chuck table 10. In the holding step ST1, the control unit 100 actuates the vacuum suction source to generate a vacuum to hold the single-crystal SiC ingot 600 under suction on the chuck table 10. According to the first embodiment, in the holding step ST1, when the single-crystal SiC ingot 600 is held under suction on the chuck table 10 under the control of the control unit 100, the single-crystal SiC ingot 600 covers the porous glass plate 12 with its outer peripheral edge portion supported on the glass frame 13, as shown in FIG. 7. After the holding step ST1 is performed, the laser processing method goes to the alignment step ST2.

(Alignment Step)

Figure 8:
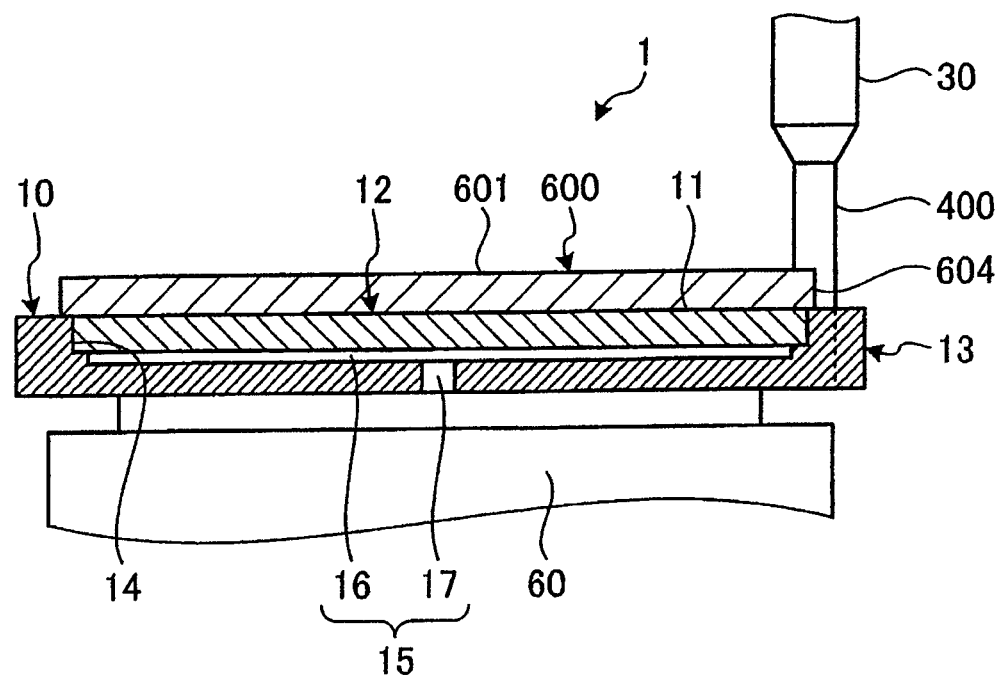
FIG. 8 is a side elevational view, partly in cross section, showing the manner in which a camera unit captures an image of an outer peripheral edge portion of the single-crystal SiC ingot in an alignment step of the laser processing method shown in FIG. 6.
Figure 9:
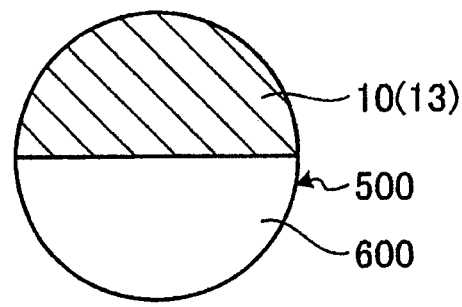
FIG. 9 is a diagram showing the image captured by the camera unit shown in FIG. 8.
Figure 10:
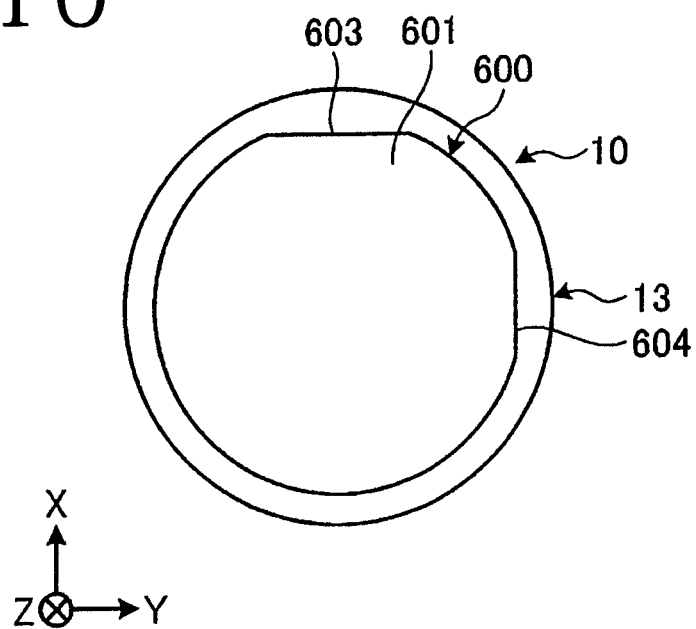
FIG. 10 is a plan view showing the single-crystal SiC ingot and the chuck table after the alignment step of the laser processing method shown in FIG. 6.

FIG. 8 is a side elevational view, partly in cross section, showing the manner in which the camera unit 30 captures an image of an outer peripheral edge portion of the single-crystal SiC ingot 600 in the alignment step ST2 of the laser processing method shown in FIG. 6. FIG. 9 is a diagram showing the image captured by the camera unit 30 shown in FIG. 8. FIG. 10 is a plan view showing the single-crystal SiC ingot 600 and the chuck table 10 after the alignment step ST2 of the laser processing method shown in FIG. 6.

The alignment step ST2 is a step for capturing, with the camera unit 30, an image of the outer peripheral edge portion of the single-crystal SiC ingot 600 held on the holding surface 11 of the chuck table 10 and the glass frame 13 while illuminating the outer peripheral edge portion of the single-crystal SiC ingot 600 and the glass frame 13 with illuminating light 400, thereby to detect a processing region of the single-crystal SiC ingot 600 which is to be processed with a laser beam and to perform an alignment process to properly orient the single-crystal SiC ingot 600 based on the captured image. In the alignment step ST2, as shown in FIG. 8, the control unit 100 controls the camera unit 30 to capture an image of the second orientation flat 604 on the outer circumferential edge of the single-crystal SiC ingot 600 and the glass frame 13 while illuminating the second orientation flat 604 and the glass frame 13 with the illuminating light 400, and performs an alignment process to properly orient the single-crystal SiC ingot 600. According to the first embodiment, in the alignment step ST2, the control unit 100 controls the camera unit 30 to capture an image 500 of two spots on the second orientation flat 602, as indicated by circles in FIG. 7, for example. In the alignment step ST2, the control unit 100 detects a direction parallel to the second orientation flat 604 from the image 500 shown in FIG. 9 that is captured by the camera unit 30.

Since the camera unit 30 applies the illuminating light 400 along the Z-axis direction and the upper surface 601 of the single-crystal SiC ingot 600 reflects the illuminating light 400, the single-crystal SiC ingot 600 appears bright as indicated by a blank area in the image 500 shown in FIG. 9, and the glass frame 13 of the chuck table 10 appears dark as indicated by a hatched area in the image 500 shown in FIG. 9. In the alignment step ST2, the control unit 100 controls the rotating unit 60 to orient the single-crystal SiC ingot 600 into a position in which the second orientation flat 604 lies parallel to the X-axis direction, as shown in FIG. 10. After the alignment step ST2, the laser processing method goes to the laser processing step ST3.

(Laser Processing Step)

Figure 11:
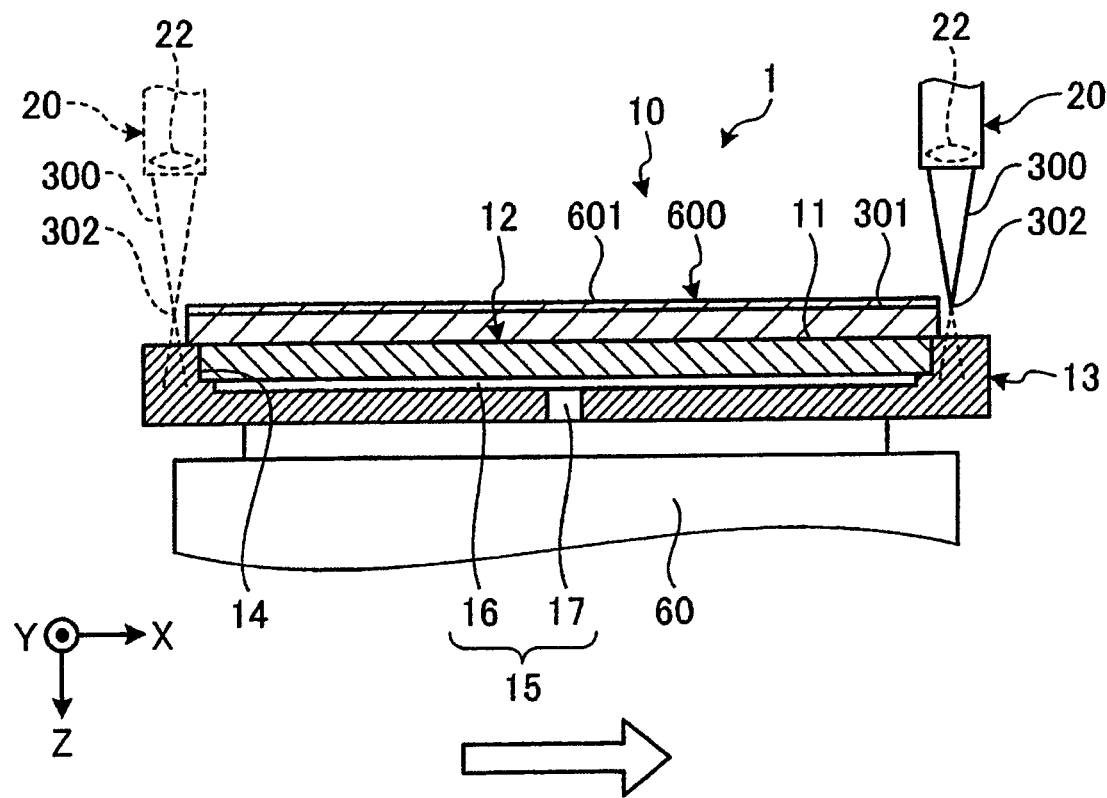
FIG. 11 is a side elevational view, partly in cross section, illustrating a laser processing step of the laser processing method shown in FIG. 6.
Figure 12:
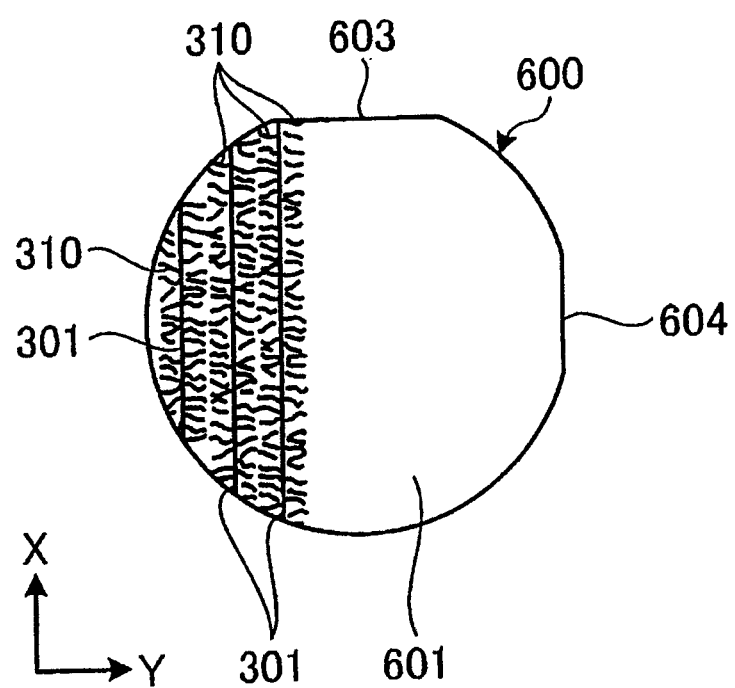
FIG. 12 is a plan view showing modified layers and cracks formed in the single-crystal SiC ingot in the laser processing step of the laser processing method shown in FIG. 6.

FIG. 11 is a side elevational view, partly in cross section, illustrating the laser processing step ST3 of the laser processing method shown in FIG. 6. FIG. 12 is a plan view showing modified layers and cracks formed in the single-crystal SiC ingot 600 in the laser processing step ST3 of the laser processing method shown in FIG. 6.

The laser processing step ST3 is a step for processing the single-crystal SiC ingot 600 with a laser beam 300, which has a wavelength that is transmittable through the single-crystal SiC ingot 600, applied from the laser beam applying unit 20 to the single-crystal SiC ingot 600 after the alignment step ST2. In the laser processing step ST3, the control unit 100 places a focal point 302 of the applied laser beam 300 in the single-crystal SiC ingot 600 at a depth corresponding to the thickness of an SiC wafer to be sliced from the single-crystal SiC ingot 600, from the upper surface 601 thereof. The control unit 100 alternately repeats a modified layer forming step of applying the laser beam 300 to the single-crystal SiC ingot 600 while moving the chuck table 10 in the X-axis direction and an indexing step of moving the chuck table 10 a predetermined distance in the Y-axis direction without applying the laser beam 300 to the single-crystal SiC ingot 600.

In the modified layer forming step, the control unit 100 controls the laser beam applying unit 20 to apply the laser beam 300 to the single-crystal SiC ingot 600 while moving the chuck table 10 along the outlined arrow in FIG. 11 so that the laser beam applying unit 20 moves from a dotted-line position to a solid-line position in FIG. 11, for example, relatively to the chuck table 10. As shown in FIG. 12, modified layers 301 parallel to the X-axis direction and cracks 310 propagated along the c-plane 607 from the modified layers 301 are now formed in the single-crystal SiC ingot 600. After the modified layers 301 and the cracks 310 have been formed in the single-crystal SiC ingot 600 in its entirety, the control unit 100 brings an end to the laser processing method. Thereafter, an SiC wafer is sliced from the single-crystal SiC ingot 600 when axially spaced portions of the single-crystal SiC ingot 600 that are positioned on both sides of the modified layers 301 and the cracks 310 are rotated relatively in opposite directions about the central axis of the single-crystal SiC ingot 600 and/or when the single-crystal SiC ingot 600 is ultrasonically vibrated.

The laser processing apparatus 1 and the laser processing method according to the first embodiment offer the following advantages:

Since the porous glass plate 12 of the chuck table 10 is made of porous glass and the glass frame 13 is made of glass, the laser beam 300 is transmitted through the chuck table 10. As the focal point 302 of the laser beam 300 is positioned in the single-crystal SiC ingot 600, the laser beam 300 is dispersed in the single-crystal SiC ingot 600 when it is transmitted through the single-crystal SiC ingot 600. As a result, the laser processing apparatus 1 prevents the chuck table 10 from being damaged by the laser beam 300 applied thereto.

The laser beam 300 is transmitted through the chuck table 10 and hence is prevented from being reflected by the chuck table 10. As a consequence, the laser processing apparatus 1 prevents the condensing lens 22 of the laser beam applying unit 20, and the like from being damaged by the laser beam 300.

Furthermore, because the glass frame 13 is made of glass, the illuminating light 400 from the camera unit 30 which is applied to the glass frame 13 is transmitted through the glass frame 13. On the other hand, the illuminating light 400 from the camera unit 30 which is applied to the single-crystal SiC ingot 600 is reflected by the single-crystal SiC ingot 600. Therefore, the contrast in brightness between the single-crystal SiC ingot 600 and the chuck table 10 in the image 500 captured by the camera unit 30 is great enough to accurately identify the second orientation flat 604 of the single-crystal SiC ingot 600. As a result, the laser processing apparatus 1 is able to reduce errors caused in the alignment process.

Still furthermore, the porous glass plate 12 of the chuck table 10 is made of porous glass and the glass frame 13 is made of glass having a specific gravity of approximately 2.5 (g/cm$^3$), rather than metal such as stainless steel or the like having a specific gravity of approximately 8 (g/cm$^3$). Consequently, the chuck table 10 is relatively light in weight, and hence burdens on the X-axis moving unit 40 and the Y-axis moving unit 50 are small when the chuck table 10 is required to move at a high speed of 500 mm/second or higher while the laser processing apparatus 1 is in operation.

Second Embodiment

Figure 13:
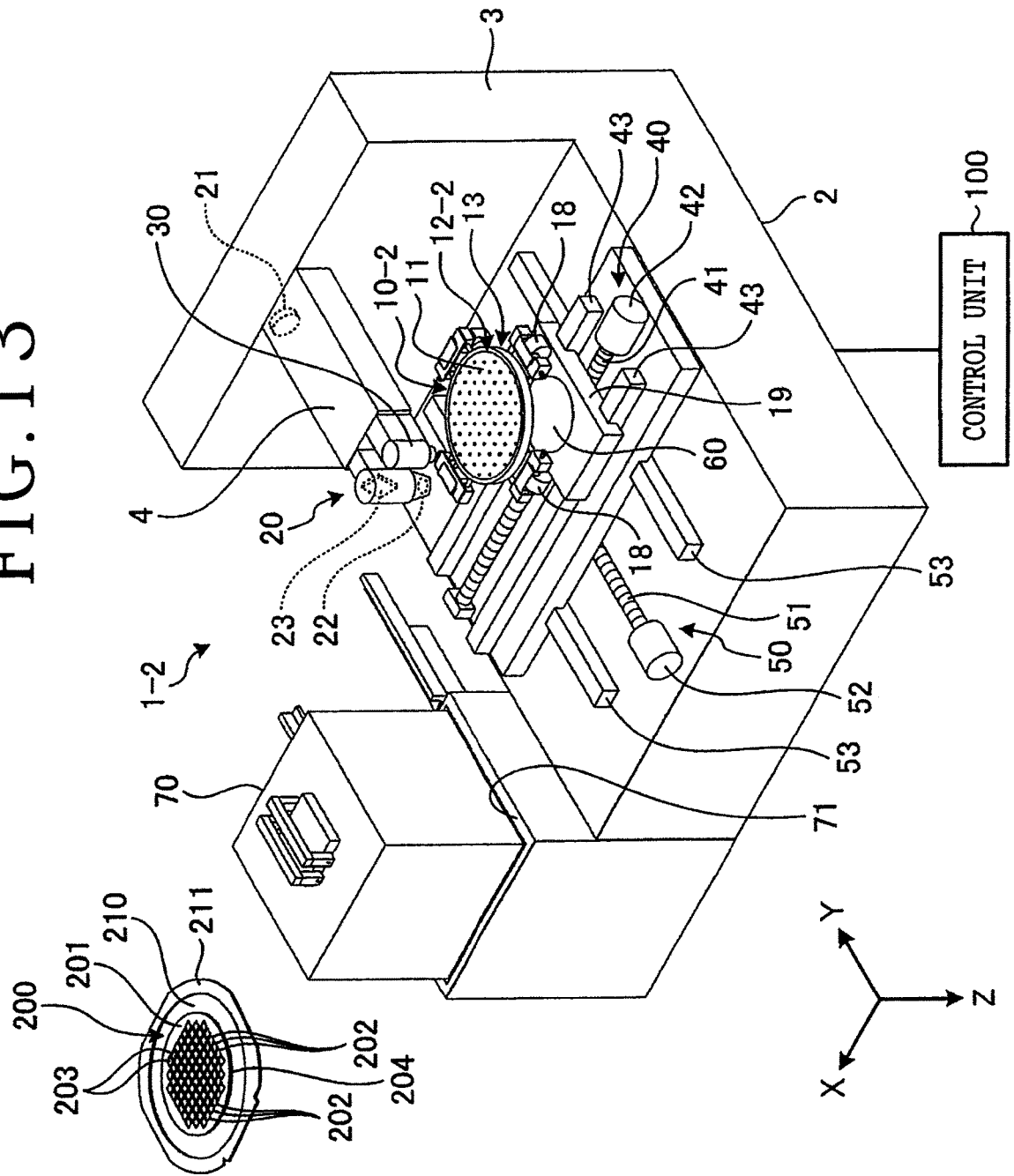
FIG. 13 is a perspective view showing by way of example a laser processing apparatus according to a second embodiment of the present invention.
Figure 14:
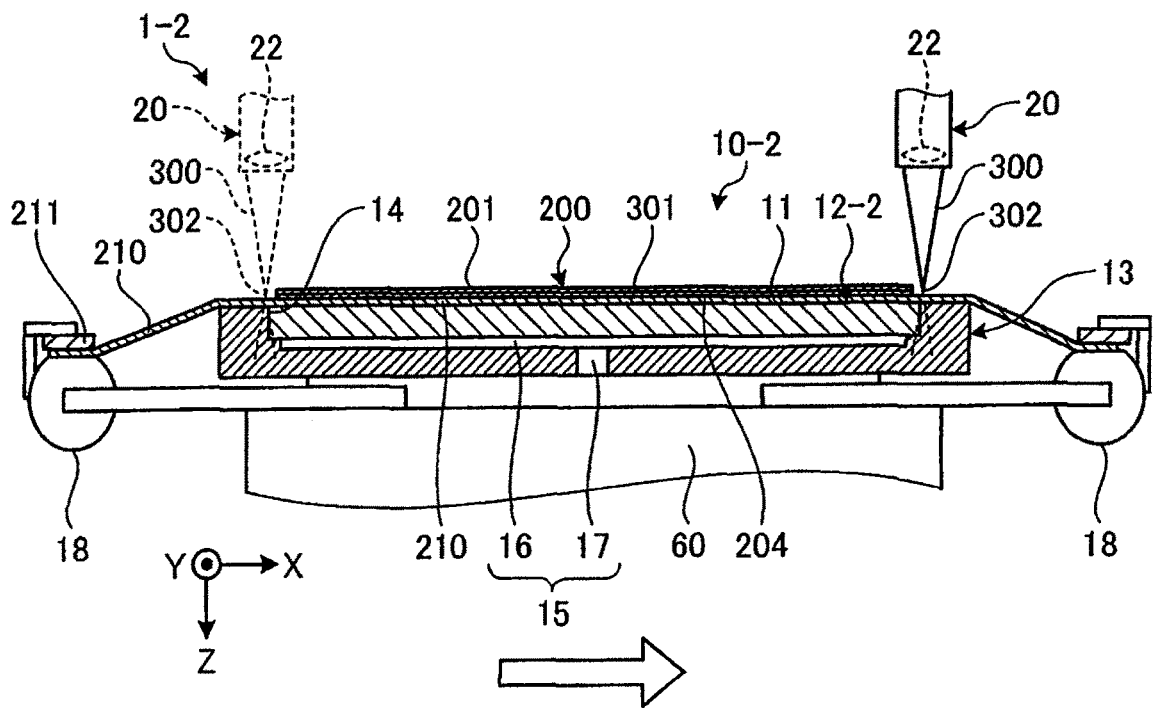
FIG. 14 is a side elevational view, partly in cross section, illustrating a laser processing step of a laser processing method according to the second embodiment.

A laser processing apparatus and a laser processing method according to a second embodiment of the present invention will be described below with reference to the drawings. FIG. 13 is a perspective view showing by way of example a laser processing apparatus according to a second embodiment of the present invention. FIG. 14 is a side elevational view, partly in cross section, illustrating a laser processing step of a laser processing method according to the second embodiment. Those parts in FIGS. 13 and 14 which are identical to those according to the first embodiment are denoted by identical reference numerals, and will not be described in detail below.

A laser processing apparatus 1-2 shown in FIG. 13 according to the second embodiment is an apparatus for processing an SiC wafer 200 as a workpiece with a laser beam. According to the second embodiment, the SiC wafer 200 to be processed by the laser processing apparatus 1-2 may be a disk-shaped semiconductor SiC wafer having a substrate of silicon, sapphire, gallium arsenide, or the like, or an optical device SiC wafer. As shown in FIG. 13, the SiC wafer 200 has on a face side 201 thereof a plurality of areas demarcated by a plurality of intersecting (orthogonally intersecting in the second embodiment) projected dicing lines 202 with respective devices 203 formed in the areas. The SiC wafer 200 has a reverse side 204 with an adhesive tape 210 stuck as a protective member thereto. The adhesive tape 210 has an outer peripheral edge portion to which an annular frame 211 is attached.

The laser processing apparatus 1-2 according to the second embodiment includes a chuck table 10-2 having a porous glass plate 12-2 made of porous glass as a porous material that provides a holding surface 11 for holding the SiC wafer 200 thereon. The porous glass plate 12-2 is in the form of a circular plate whose diameter is larger than the outside diameter of the SiC wafer 200. The porous glass plate 12-2 is thus made of porous glass as the porous material of the holding surface 11 and has a diameter larger than the outside diameter of a workpiece, i.e., the SiC wafer 200. The laser processing apparatus 1-2 also includes a cassette support base 71 for supporting thereon a cassette 70 that houses therein a plurality of SiC wafers 200 supported on respective annular frames 211, and a delivery unit, not shown, for delivering an SiC wafer 200 between the cassette 70 on the cassette support base 71 and the chuck table 10-2. A plurality of clamps 18 for clamping the annular frame 211 that supports the SiC wafer 200 on the holding surface 11 are provided around the chuck table 10-2.

The laser processing method according to the second embodiment includes a holding step ST1, an alignment step ST2, and a laser processing step ST3 as is the case with the first embodiment. The laser processing method according to the second embodiment is carried out when the operator operates an input unit to register processing detail information in the control unit 100, places the cassette 70 housing a plurality of SiC wafers 200 to be processed with a laser beam on the cassette support base 71, and then enters a command to start a laser processing operation.

In the holding step ST1 of the laser processing method according to the second embodiment, the control unit 100 controls the delivery unit to remove one SiC wafer 200 to be processed with a laser beam from the cassette 70 and to place the removed SiC wafer 200 on the holding surface 11 of the chuck table 10-2 with the adhesive tape 210 interposed therebetween. In the holding step ST1, the control unit 100 actuates the vacuum suction source to hold the SiC wafer 200 under suction on the chuck table 10-2 and controls the clamps 18 to clamp the annular frame 211. In the holding step ST1 according to the second embodiment, the adhesive tape 210 stuck to the SiC wafer 200 covers the porous glass plate 12 and the glass frame 13.

In the alignment step ST2 of the laser processing method according to the second embodiment, the control unit 100 controls the X-axis moving unit 40 and the Y-axis moving unit 50 to position the processing region of the SiC wafer 200 to be processed with a laser beam directly below the camera unit 30, performs an image processing sequence such as pattern matching or the like on an image captured by the camera unit 30 for positioning the projected dicing lines 202 on the SiC wafer 200 with respect to the laser beam applying unit 20, and then carries out an alignment process.

The laser processing step ST3 of the laser processing method according to the second embodiment is a step of applying a laser beam 300 having a wavelength that is transmittable through the SiC wafer 200 to the SiC wafer 200 along the projected dicing lines 202, thereby to form modified layers 301 serving as severance initiating points in the SiC wafer 200.

In the laser processing step ST3 according to the second embodiment, the control unit 100 controls the laser beam applying unit 20 to apply the laser beam 300 to the SiC wafer 200 with the focal point 302 of the applied laser beam 300 positioned in the SiC wafer 200 while at the same time controlling the X-axis moving unit 40 and the Y-axis moving unit 50 to move the laser beam applying unit 20 and the chuck table 10-2 relatively to each other along the projected dicing lines 202 on the basis of the result of the alignment process in the alignment step ST2.

Specifically, the control unit 100 controls the laser beam applying unit 20 to apply the laser beam 300 to the SiC layer 200 while moving the chuck table 10-2 along the outlined arrow in FIG. 14 so that the laser beam applying unit 20 moves from a dotted-line position to a solid-line position in FIG. 14, for example, relatively to the chuck table 10-2. In the laser applying step ST3, modified layers 301 are thus formed in the SiC wafer 200 along the projected dicing lines 202. When modified layers 301 have been formed in the SiC wafer 200 along all the projected dicing lines 202, the control unit 100 controls the delivery unit to return the SiC wafer 200 with the modified layers 301 formed therein into the cassette 70, whereupon the laser processing method comes to an end.

The laser processing apparatus 1-2 and the laser processing method according to the second embodiment offer the following advantages:

As with the first embodiment, since the porous glass plate 12-2 of the chuck table 10-2 is made of porous glass and the glass frame 13 is made of glass, the laser beam 300 is transmitted through the chuck table 10-2. As a result, the laser processing apparatus 1-2 prevents the chuck table 10-2 from being damaged by the laser beam 300 applied thereto and also prevents the condensing lens 22 of the laser beam applying unit 20, and the like from being damaged by the laser beam 300.

Furthermore, as the porous glass plate 12 of the chuck table 10-2 is made of porous glass, the chuck table 10-2 is relatively light in weight, and hence burdens on the X-axis moving unit 40 and the Y-axis moving unit 50 are small when the chuck table 10-2 is required to move at a high speed of 500 mm/second or higher while the laser processing apparatus 1-2 is in operation.

Modifications

Figure 15:
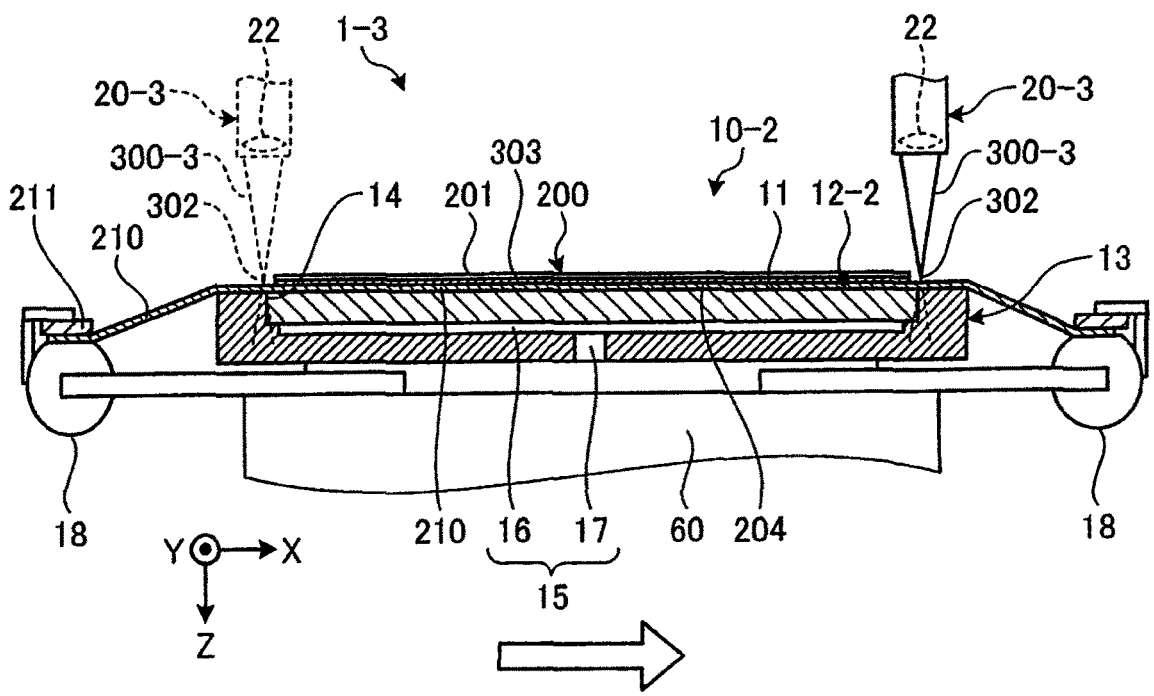
FIG. 15 is a side elevational view, partly in cross section, showing the manner in which a laser processing apparatus according to a modification of the second embodiment carries out a laser processing step.

A laser processing apparatus and a laser processing method according to a modification of the second embodiment will be described below with reference to the drawings. FIG. 15 is a side elevational view, partly in cross section, showing the manner in which a laser processing apparatus according to a modification of the second embodiment carries out a laser processing step. Those parts in FIG. 15 which are identical to those according to the first and second embodiments are denoted by identical reference numerals, and will not be described in detail below.

The laser processing apparatus, denoted by 1-3, according to the modification of the second embodiment is structurally the same as the laser processing apparatus 1-2 according to the second embodiment except that a laser beam applying unit 20-3 applies a laser beam 300-3 having a wavelength of 355 nm, for example, that is absorbable by the SiC wafer 200. The laser processing method according to the modification of the second embodiment is the same as the laser processing method according to the second embodiment except that the laser beam 300-3 is applied to the projected dicing lines 202 on the SiC wafer 200 as shown in FIG. 15, to perform an ablation process thereon for thereby forming laser-processed grooves 303 in the SiC wafer 200 along the projected dicing lines 202. According to the modification of the second embodiment, the laser-processed grooves 303 are formed in the SiC wafer 200 to half cut the SiC wafer 200. However, laser-processed grooves may be formed in the SiC wafer 200 to fully cut the SiC wafer 200 according to the present invention.

The laser processing apparatus 1-3 and the laser processing method according to the modification of the second embodiment offer the following advantages:

As with the second embodiment, since the porous glass plate 12-2 of the chuck table 10-2 is made of porous glass and the glass frame 13 is made of glass, the laser beam 300-3 and the illuminating light 400 are transmitted through the chuck table 10-2. As a result, the laser processing apparatus 1-3 and the laser processing method prevent the chuck table 10-2 from being damaged by the laser beam 300-3 applied thereto and also prevent the condensing lens 22 of a laser beam applying unit 20-3 and the like. from being damaged by the laser beam 300-3.

Figure 16:
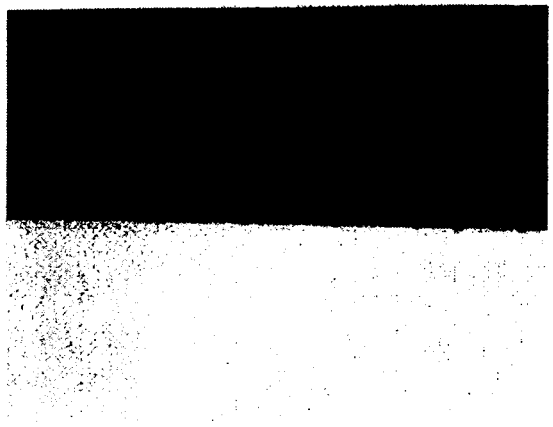
FIG. 16 is a diagram showing an image captured of the chuck table that has held a single-crystal SiC ingot, of the laser processing apparatus according to the first embodiment.
Figure 17:
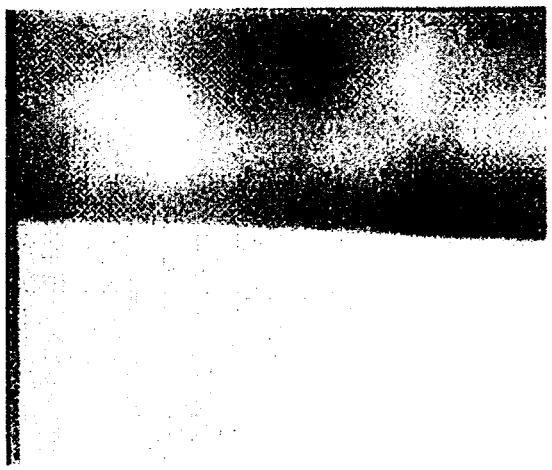
FIG. 17 is a diagram showing an image captured of a conventional chuck table that has held a single-crystal SiC ingot.

The inventor of the present invention captured, with the camera unit 30, images of the chuck table 10 of the laser processing apparatus 1 according to the first embodiment and a conventional chuck table of a porous material surrounded by a frame of metal, while they were holding respective single-crystal SiC ingots 600. FIG. 16 shows an image captured of the chuck table 10 that has held the single-crystal SiC ingot, of the laser processing apparatus 1 according to the first embodiment. FIG. 17 shows an image captured of the conventional chuck table that has held the single-crystal SiC ingot. The images shown in FIGS. 16 and 17 represent areas in the spots indicated by the circles in FIG. 7. FIGS. 16 and 17 clearly indicate that the contrast in brightness between the single-crystal SiC ingot 600 and the glass frame 13 is greater on the chuck table 10 of the laser processing apparatus 1 according to the first embodiment than on the conventional chuck table. Consequently, it can be seen from FIGS. 16 and 17 that the chuck table 10 which includes the glass frame 13 made of glass is effective to reduce errors caused in the alignment process.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a workpiece on a holding surface thereof;
a laser beam applying unit configured to apply a laser beam to the workpiece held on the holding surface of said chuck table;
a camera unit configured to capture an image of the workpiece held on the holding surface of said chuck table;
wherein said chuck table includes:
a porous material making up said holding surface; and
a glass frame made of a non-porous material and having a recess defined therein for receiving said porous material fitted therein, said glass frame having a negative pressure transfer path in the center of said recess for transferring a negative pressure to the porous material fitted in said recess, said negative pressure transfer path including a transfer hole that extends through a bottom surface of said glass frame and is coupled to a vacuum suction source; and
a rotating unit attached directly to a bottom surface of said glass frame, said rotating unit configured to rotate said glass frame and said holding surface about a central vertical axis.

2. The laser processing apparatus according to claim 1, wherein said porous material is provided as a porous glass plate.

3. The laser processing apparatus according to claim 2, further comprising:
a table base movable with respect to said laser beam applying unit, said glass frame being mounted on said table base.

4. The laser processing apparatus according to claim 2, wherein said laser beam applying unit includes a laser oscillator for oscillating said laser beam and a condensing lens for focusing the laser beam oscillated by said laser oscillator, said condensing lens being disposed in facing relation to the holding surface of said chuck table.

5. The laser processing apparatus according to claim 2, wherein the workpiece held on said chuck table has an outer peripheral edge portion supported on said glass frame in covering relation to said porous glass plate, and said glass frame transmits therethrough illuminating light emitted by said camera unit.

6. The laser processing apparatus according to claim 2, wherein said laser beam has a wavelength that is transmittable through said workpiece.

7. The laser processing apparatus according to claim 2, wherein said laser beam has a wavelength that is absorbable by said workpiece.

8. The laser processing apparatus according to claim 1, wherein said glass frame defines a space below said recess that is in communication with said transfer path.

9. The laser processing apparatus according to claim 8, wherein a diameter of said space is less than a diameter of said recess.

10. The laser processing apparatus according to claim 1, wherein a diameter of the workpiece is less than a diameter of said glass frame.

11. A laser processing apparatus comprising:
a chuck table for holding a workpiece on a holding surface thereof;
a laser beam applying unit configured to apply a laser beam to the workpiece held on the holding surface of said chuck table; and
a camera unit configured to capture an image of the workpiece held on the holding surface of said chuck table;
wherein said chuck table includes:
a porous material making up said holding surface and provided as a porous glass plate;
a glass frame made of a non-porous material and having a recess defined therein for receiving said porous material fitted therein, and a negative pressure transfer path for transferring a negative pressure to the porous material fitted in said recess; and
a rotating unit attached directly to a bottom surface of said glass frame, and configured to rotate said holding surface about a central vertical axis,
wherein the workpiece held on said chuck table has an outer peripheral edge portion supported on said glass frame in covering relation to said porous glass plate, said glass frame has an outer peripheral portion protruding radially outward from the outer peripheral edge portion of the workpiece, an upper surface of the outer peripheral portion is flush with said holding surface, and said glass frame transmits therethrough illuminating light emitted by said camera unit.

12. The laser processing apparatus according to claim 11, further comprising:
a table base movable with respect to said laser beam applying unit, said glass frame being mounted on said table base.

13. The laser processing apparatus according to claim 11, wherein said laser beam applying unit includes a laser oscillator for oscillating said laser beam and a condensing lens for focusing the laser beam oscillated by said laser oscillator, said condensing lens being disposed in facing relation to the holding surface of said chuck table.

14. The laser processing apparatus according to claim 11, wherein said laser beam has a wavelength that is transmittable through said workpiece or a wavelength that is absorbable by said workpiece.

15. A laser processing apparatus comprising:
a chuck table for holding a workpiece on a holding surface thereof;
a laser beam applying unit configured to apply a laser beam to the workpiece held on the holding surface of said chuck table;
a camera unit configured to capture an image of the workpiece held on the holding surface of said chuck table; and
a rotating unit for rotating the chuck table about its central axis;
wherein said chuck table includes:
a porous material making up said holding surface and provided as a porous glass plate; and
a glass frame made of a non-porous material and having a recess defined therein for receiving said porous material fitted therein, and a negative pressure transfer path for transferring a negative pressure to the porous material fitted in said recess, said rotating unit attached directly to a bottom surface of said glass frame, and configured to rotate said holding surface about a central vertical axis,
wherein the workpiece held on said chuck table has an outer peripheral edge portion supported on said glass frame in covering relation to said porous glass plate, said glass frame has an inner portion radially inward from an outer peripheral edge of said recess, the rotating unit supports a bottom surface of the inner portion, and said glass frame transmits therethrough illuminating light emitted by said camera unit.

16. The laser processing apparatus according to claim 15, further comprising:
a table base movable with respect to said laser beam applying unit, said glass frame being mounted on said table base.

17. The laser processing apparatus according to claim 15, wherein said laser beam applying unit includes a laser oscillator for oscillating said laser beam and a condensing lens for focusing the laser beam oscillated by said laser oscillator, said condensing lens being disposed in facing relation to the holding surface of said chuck table.

18. The laser processing apparatus according to claim 15, wherein said laser beam has a wavelength that is transmittable through said workpiece or a wavelength that is absorbable by said workpiece.

* * * * *